US009125324B2

(12) United States Patent
Yen et al.

(10) Patent No.: US 9,125,324 B2
(45) Date of Patent: Sep. 1, 2015

(54) MOTHERBOARD

(75) Inventors: Heng-Yu Yen, Taipei (TW); Pai-Ching Huang, Taipei (TW)

(73) Assignee: ASUSTeK COMPUTER INC., Taipei (TW)

(*) Notice: Subject to any disclaimer, the term of this patent is extended or adjusted under 35 U.S.C. 154(b) by 279 days.

(21) Appl. No.: 13/434,879

(22) Filed: Mar. 30, 2012

(65) Prior Publication Data

US 2012/0257356 A1 Oct. 11, 2012

(30) Foreign Application Priority Data

Apr. 8, 2011 (TW) ............................ 100112227 A

(51) Int. Cl.

| | |
|---|---|
| ***H05K 7/20*** | (2006.01) |
| *H01L 23/24* | (2006.01) |
| *H01L 23/427* | (2006.01) |
| *G06F 1/20* | (2006.01) |

(52) U.S. Cl.

CPC .............. *H05K 7/20454* (2013.01); *G06F 1/20* (2013.01); *H01L 23/4275* (2013.01)

(58) Field of Classification Search

CPC ................. H05K 7/20454; H05K 7/20; H01L 23/42–23/4275

USPC ....................... 361/679.46–679.54, 688–723; 165/80.1–80.5, 104.33, 185; 257/712–722; 174/15.1–15.2, 174/16.1–16.3, 521, 526, 547, 548

See application file for complete search history.

(56) References Cited

U.S. PATENT DOCUMENTS

| | | | | |
|---|---|---|---|---|
| 3,586,102 | A * | 6/1971 | Gilles | 165/186 |
| 4,997,032 | A * | 3/1991 | Danielson et al. | 165/46 |
| 5,000,256 | A * | 3/1991 | Tousignant | 165/46 |
| 5,006,924 | A * | 4/1991 | Frankeny et al. | 257/714 |
| 5,485,671 | A * | 1/1996 | Larson et al. | 29/890.032 |
| 5,608,610 | A * | 3/1997 | Brzezinski | 361/704 |
| 6,504,720 | B2 * | 1/2003 | Furuya | 361/699 |
| 6,819,566 | B1 * | 11/2004 | Danovitch et al. | 361/704 |
| 7,096,926 | B2 * | 8/2006 | Belady et al. | 165/46 |
| 7,514,784 | B2 * | 4/2009 | Mayuzumi et al. | 257/712 |
| 7,623,349 | B2 * | 11/2009 | Refai-Ahmed et al. | 361/719 |
| 7,889,503 | B2 * | 2/2011 | Nagareda et al. | 361/719 |
| 8,432,696 | B2 * | 4/2013 | Ribas et al. | 361/714 |
| 2005/0127500 | A1 | 6/2005 | Colgan et al. | |
| 2007/0000655 | A1 * | 1/2007 | Uchida et al. | 165/170 |
| 2008/0291639 | A1 * | 11/2008 | Li et al. | 361/719 |
| 2009/0052139 | A1 | 2/2009 | Lai et al. | |
| 2009/0215508 | A1 | 8/2009 | Huang et al. | |

FOREIGN PATENT DOCUMENTS

| | | |
|---|---|---|
| CN | 2786690 | 6/2006 |
| TW | 445020 | 7/2001 |
| TW | M243584 | 9/2004 |
| TW | 201026834 | 7/2010 |
| TW | M391275 | 10/2010 |

* cited by examiner

*Primary Examiner* — Zachary M Pape

(74) *Attorney, Agent, or Firm* — Jianq Chyun IP Office

(57) ABSTRACT

A motherboard includes a circuit board, a plurality of electronic components, a metal cover and a flexible heat-conducting component. The electronic components are disposed at the circuit board. The metal cover covers the circuit board. The flexible heat-conducting component is disposed between the circuit board and the metal cover and contacts the electronic components and the metal cover.

8 Claims, 6 Drawing Sheets

130 132 132 132 132 132 140 240a 242 244 240 120 120 120 150 150 150 120 150 150 150 110 120 150 100

MOTHERBOARD

CROSS-REFERENCE TO RELATED APPLICATION

This application claims the priority benefit of Taiwan application serial no. 100112227, filed on Apr. 8, 2011. The entirety of the above-mentioned patent application is hereby incorporated by reference herein and made a part of this specification.

BACKGROUND OF THE INVENTION

1. Field of the Invention

The invention relates to a motherboard and, more particularly, to a motherboard with a cover.

2. Description of the Related Art

As computer technology develops rapidly, operation speed of the computer is greatly improved, and thus heating power of electronic components in the computer host increases. In order to prevent the electronic components from temporary or permanent failure due to overheating, the electronic components need sufficient heat dissipating efficiency.

A motherboard may be placed at a working place directly instead of accommodated in a computer casing to get better heat dissipating efficiency. However, if the electronic components at the motherboard are not shielded by the casing, they are easily affected by electromagnetic interference (EMI).

BRIEF SUMMARY OF THE INVENTION

A motherboard with good EMI shielding effect and high heat dissipating efficiency is disclosed.

A motherboard disclosed herein includes a circuit board, a plurality of electronic components, a metal cover and a flexible heat-conducting component. The electronic components are disposed at the circuit board. The metal cover covers the circuit board. The flexible heat-conducting component is disposed between the circuit board and the metal cover and contacts the electronic components and the metal cover.

These and other features, aspects and advantages of the present invention will become better understood with regard to the following description, appended claims, and accompanying drawings.

DETAILED DESCRIPTION OF THE EMBODIMENTS

Figure 1:
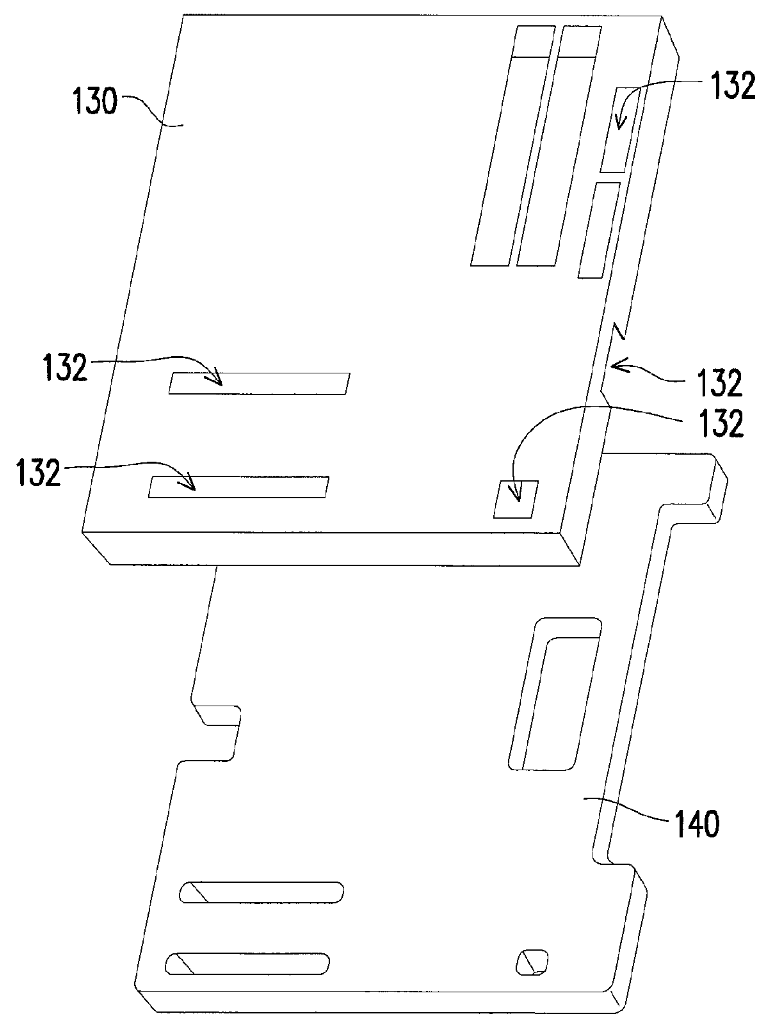
FIG. 1 is an exploded diagram showing a motherboard in a first embodiment.
Figure 1:
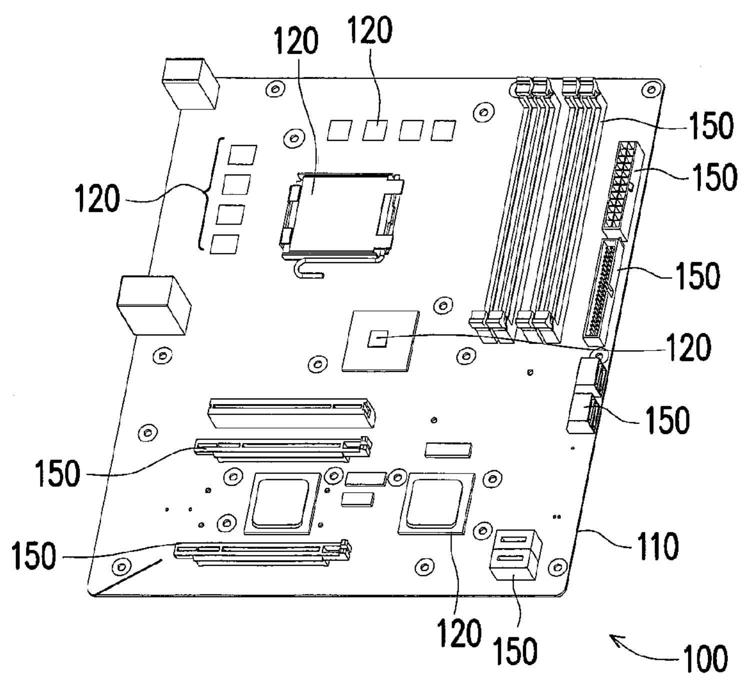
Figure 2:
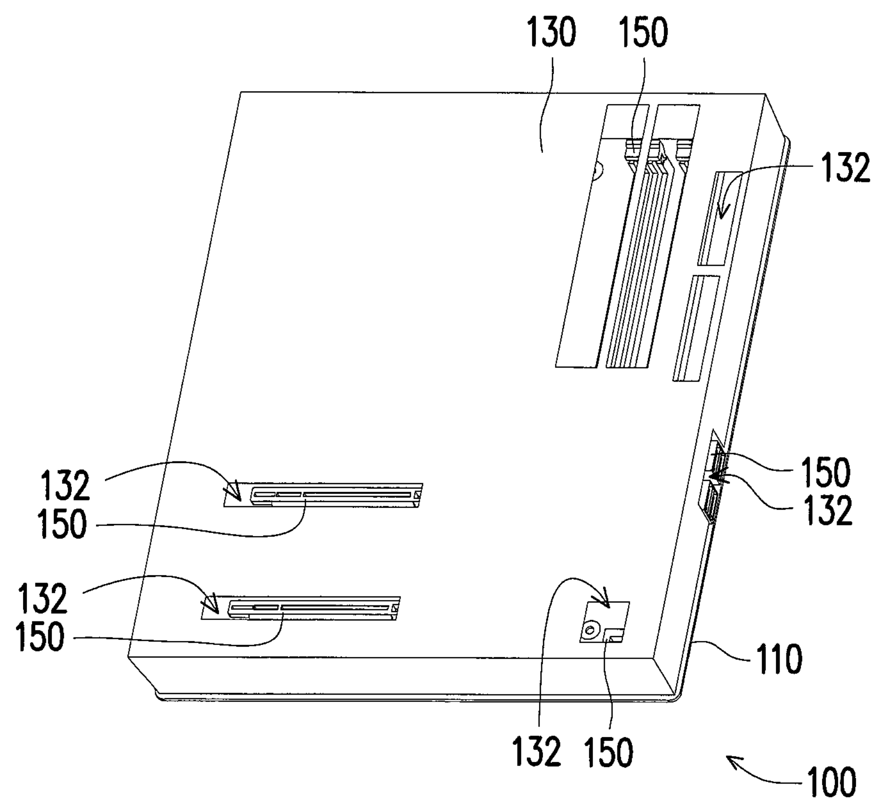
FIG. 2 is an schematic diagram showing the assembled motherboard in FIG. 1.
Figure 3:
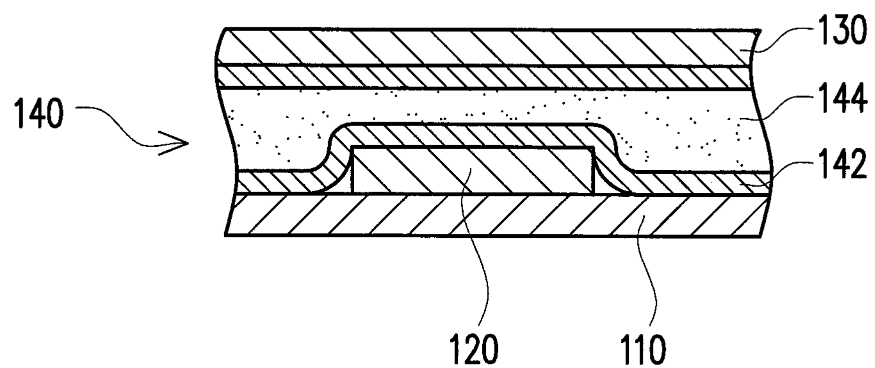
FIG. 3 is a sectional schematic diagram showing the motherboard in FIG. 2.

FIG. 1 is an exploded diagram showing a motherboard in a first embodiment. FIG. 2 is a schematic diagram showing the assembled motherboard in FIG. 1. FIG. 3 is a sectional schematic diagram showing the motherboard in FIG. 2. A motherboard 100 includes a circuit board 110, a plurality of electronic components 120, a metal cover 130 and a flexible heat-conducting component 140. The electronic components 120 are disposed at the circuit board 110, and the metal cover 130 covers the circuit board 110. The flexible heat-conducting component 140 is disposed between the circuit board 110 and the metal cover 130 and contacts the electronic components 120 and the metal cover 130. The number of the electronic components 120 is not limited herein. The electronic components 120 may be, but not limited to, a south bridge chip, a north bridge chip, a network chip, a graphic processing unit (GPU), a sound chip, a capacitor or a resistance.

The metal cover 130 covers the circuit board 110 and shields the electronic components 120 at the circuit board 110 to improve the EMI shielding effect of the motherboard 100. Moreover, since the flexible heat-conducting component 140 is flexible and can be shaped in varies outlooks, therefore, it is suitable to wrap the electronic components 120 and contact with the metal cover 130 closely. The flexible heat-conducting component 140 absorbs heat from the electronic components 120 rapidly and conducts the heat to the metal cover 130 evenly; therefore, the heat dissipating efficiency is improved. Moreover, since the metal cover 130 covers the circuit board 110, the strip line effect is generated to improve the signal transmission quality of the circuit board 110.

In FIG. 3, the flexible heat-conducting component 140 includes a flexible bag 142 within heat conducting material 144. The heat conducting material 144 such as sulfate is placed inside the flexible bag 142. When the temperature of the sulfate increases to a specific temperature (such as 30° C. to 40° C.), it converts from solid state to liquid state. Thus, in the process to assemble the circuit board 110, the metal cover 130 and the flexible heat-conducting component 140, the flexible heat-conducting component 140 can be heated to a specific temperature to convert the heat conducting material 144 therein from solid state to liquid state, and then the flexible heat-conducting component 140 is pressed by the metal cover 130 to cover the electronic components 120 at the circuit board 110 and contact with the metal cover 130 closely. The heat conducting material 144 is not limited herein, and it also may be other material which has the characteristics to convert from solid state to liquid state based on the change of the temperature.

As shown in FIG. 1 and FIG. 2, the motherboard 100 further includes a plurality of connectors 150 disposed on the circuit board 110. The metal cover 130 includes multiple openings 132, and the shape and size of the openings 132 correspond to that of the connectors 150, respectively. The orthographic projection of the flexible heat-conducting component 140 on the metal cover 130 does not overlap with that of the openings 132, thus to expose the connectors 150 for the users to insert peripheral components to the motherboard 100, such as expansion cards or memories. In other words, the flexible heat-conducting component 140 may include a plurality of openings to expose the connectors 150, as shown in FIG. 1.

The number of the connectors 150 is not limited herein. Furthermore, a central processing unit (CPU) and a memory module may be selectively disposed at the motherboard 100. The connectors 150 may include CPU connectors, memory connectors, data line connectors (for connecting a hard disk, an optical disk drive or other memory devices), power line connectors and universal serial bus (USB) connectors, which is not limited herein.

Figure 4:
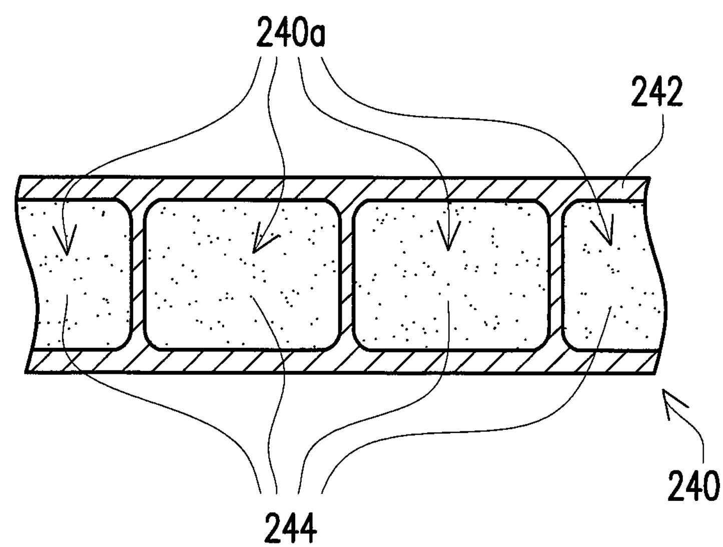
FIG. 4 is a sectional schematic diagram showing a flexible heat-conducting component in another embodiment.

FIG. 4 is a sectional schematic diagram showing a flexible heat-conducting component in another embodiment. In the embodiment, the flexible bag 242 is divided into multiple accommodating spaces 240*a*, and the heat conducting material 244 is placed in the accommodating spaces 240*a*. Thus, it can avoid that the heat conducting material 244 accumulates in a partial area of the flexible bag 242 which leads to low heat conducting efficiency of the flexible heat-conducting component 240.

Figure 5:
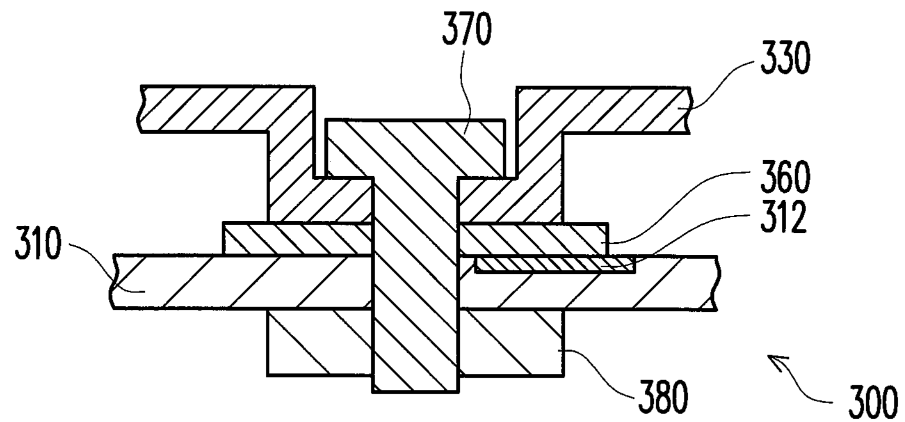
FIG. 5 is a sectional schematic diagram showing a motherboard in a second embodiment.

FIG. 5 is a sectional schematic diagram showing a motherboard in a second embodiment. The circuit board 310 includes a ground pad 312, and the metal cover 330 is electrically connected to the ground pad 312 to improve the EMI shielding effect. In detail, a metal spacer 360 is further disposed on the motherboard 300 between the metal cover 330 and the ground pad 312, thus to electrically connect the metal cover 330 to the ground pad 312 via the metal spacer 360. Additionally, the motherboard 300 further includes a fastener 370. The fastener 370 is screwed to a screw cap 380 to fasten the metal cover 330 to the circuit board 310.

Figure 6:
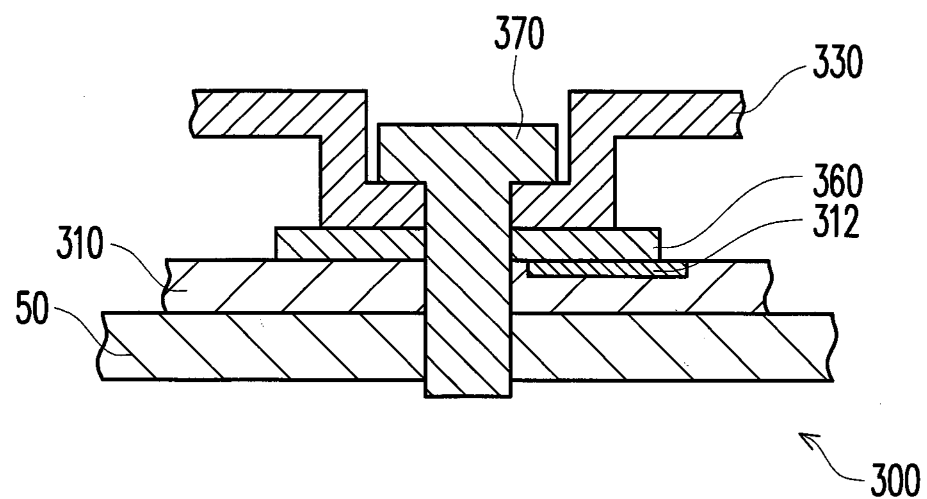
FIG. 6 is a schematic diagram showing that a fastener in FIG. 5 is screwed to a device casing.

FIG. 6 is a schematic diagram showing that a fastener in FIG. 5 is screwed to a device casing. The fastener 370 can not only be screwed to the screw cap 380 as shown in FIG. 5, it also can be screwed to a device casing 50 as shown in FIG. 6 to fasten the motherboard 300 to the device casing 50. The metal cover 330 may be connected to the device casing 50 via the fastener 370 for grounding to further improve the EMI shielding effect.

Figure 7:
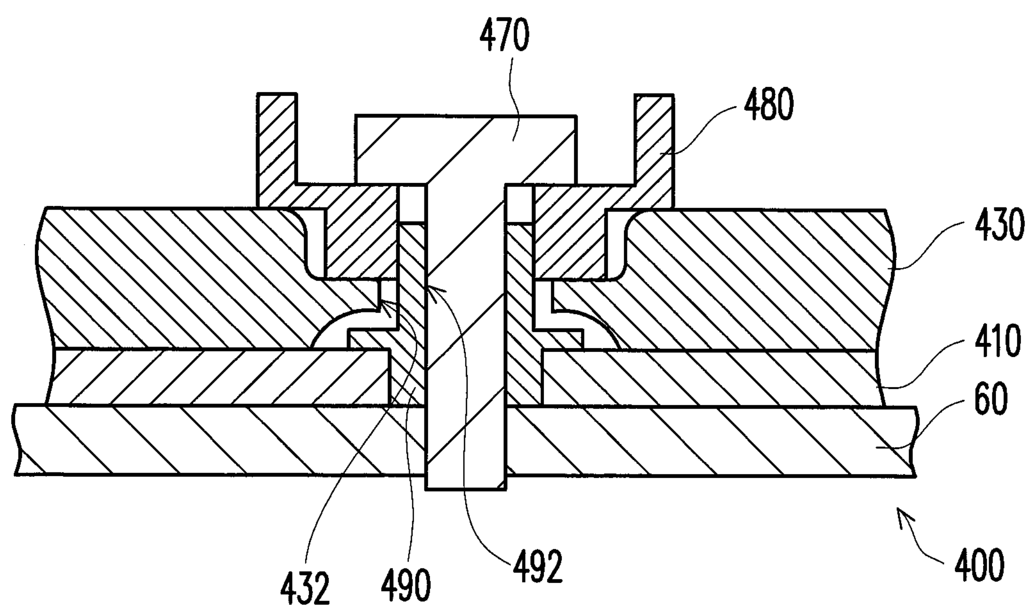
FIG. 7 is a schematic diagram showing a motherboard in a third embodiment.
Figure 8:
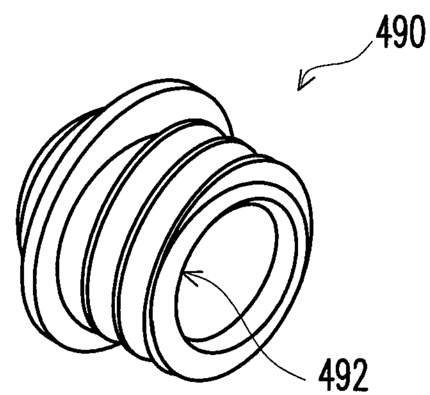
FIG. 8 is a schematic diagram showing a screw bolt in FIG. 7.
Figure 9:
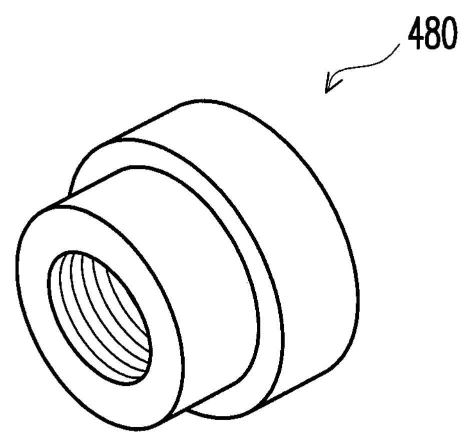
FIG. 9 is a schematic diagram showing a screw cap in FIG. 7.

FIG. 7 is a schematic diagram showing a motherboard in a third embodiment. FIG. 8 is a schematic diagram showing a screw bolt in FIG. 7. FIG. 9 is a schematic diagram showing a screw cap in FIG. 7. The motherboard 400 includes a screw cap 480 and a screw bolt 490. The screw bolt 490 is fixed at the circuit board 410; the metal cover 430 includes a whole 432, and the screw bolt 490 passes through the whole 432. The screw cap 480 is screwed to the screw bolt 490 and limits the metal cover 430 to the circuit board 410.

Furthermore, the screw bolt 490 passes through the circuit board 410 and includes a through whole 492. The motherboard 400 further includes a fastener 470. The fastener 470 contacts the screw cap 480, passes through the through hole 492 and is screwed to the device casing 60 to make the metal cover 430 connected to the device casing 60 for grounding, so as to further improve the EMI shielding effect.

In sum, according to the motherboard disclosed above, the metal cover covers the circuit board and shields the electronic components at the circuit board to improve the EMI shielding effect of the motherboard. Moreover, since the flexible heat-conducting component is flexible, it can cover the electronic components completely and contact the metal cover closely. The flexible heat-conducting component absorbs heat from the electronic components rapidly and conducts the heat to the metal cover evenly, and thus the heat dissipating efficiency is improved. Furthermore, the heat conducting material can be placed separately in multiple accommodating spaces of the flexible bag to avoid that the heat conducting material accumulates in a partial area of the flexible bag to reduce the heat conducting efficiency of the flexible heat-conducting component. Additionally, the metal cover can be connected to the circuit board or the device casing for grounding to further improve the EMI shielding effect.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A motherboard, comprising:

a circuit board;

a plurality of electronic components disposed at the circuit board;

a metal cover covering the circuit board;

a fastener fixing the metal cover to the circuit board, wherein the fastener is fastened to a device casing to make the metal cover connected to the device casing for grounding; and a flexible heat-conducting component disposed between the circuit board and the metal cover and contacting the electronic components and the metal cover, wherein the flexible heat-conducting component includes a flexible bag and a heat conducting material placed in the flexible bag, the flexible bag comprises vertical walls extending from a bottom of the flexible bag to a top of the flexible bag, and the flexible bag is divided into multiple accommodating spaces by the vertical walls, the heat conducting material is placed in the accommodating spaces.

2. The motherboard according to claim 1, wherein the heat conducting material includes sulfate.

3. The motherboard according to claim 1, wherein when the heat conducting material is under a specific temperature range, the heat conducting material converts from solid state to liquid state.

4. The motherboard according to claim 1, wherein the motherboard further includes a plurality of connectors disposed at the circuit board, the metal cover includes a plurality of openings, and the shape and size of the openings correspond to that of the connectors at the circuit board, respectively.

5. The motherboard according to claim 4, wherein the connectors are central processing unit (CPU) connectors, memory connectors, data line connectors, video graphic array (VGA) connectors, power line connectors or universal serial bus (USB) connectors.

6. The motherboard according to claim 4, wherein orthographic projection of the flexible heat-conducting component at the metal cover does not overlap with the openings to expose the connectors.

7. The motherboard according to claim 1, wherein a ground pad is further disposed at the circuit board, which is electrically connected to the metal cover.

8. The motherboard according to claim 1, wherein the motherboard further includes a metal spacer which disposed between the metal cover and the ground pad, and the metal cover is electrically connected to the ground pad via the metal spacer.

* * * * *